United States Patent [19]
Eaglesham et al.

[11] Patent Number: 6,043,139
[45] Date of Patent: Mar. 28, 2000

[54] PROCESS FOR CONTROLLING DOPANT DIFFUSION IN A SEMICONDUCTOR LAYER

[75] Inventors: David James Eaglesham, Hudson; Hans-Joachim Ludwig Gossmann; John Milo Poate, both of Union; Peter Adriaan Stolk, Morris, all of N.J.

[73] Assignee: Lucent Technologies Inc., Murray Hill, N.J.

[21] Appl. No.: 08/563,688

[22] Filed: Nov. 28, 1995

Related U.S. Application Data

[62] Division of application No. 08/348,013, Dec. 1, 1994, Pat. No. 5,731,626.

[51] Int. Cl.$^7$ .............................. H01L 21/20; H01L 21/22
[52] U.S. Cl. .......................... 438/495; 438/510; 438/542; 438/918; 257/607
[58] Field of Search ..................................... 438/495, 510, 438/511, 528, 542, 918; 257/65, 607

[56] References Cited

U.S. PATENT DOCUMENTS 5,116,455  5/1992  Daly .
5,145,794  9/1992  Kase et al. .
5,338,945  8/1994  Baliga et al. .

FOREIGN PATENT DOCUMENTS 0 419 128 A1  3/1991  European Pat. Off. .
0 452 741 A2  10/1991  European Pat. Off. .
0 565 901 A1  10/1993  European Pat. Off. .
57-034332  2/1982  Japan .

OTHER PUBLICATIONS

Nishikawa et al., "Reduction of transient boron diffusion in preamorphized Si by carbon implantation", Appl. Phys. Lett. vol. 60, No. 18., pp. 2270–2272, *Semiconductor Technology Laboratory*, Tokyo, Japan, (Apr. 1992).

D.E. Carlson et al., "The Effects of Imparities on the Diffusion Length in Amorphous Silicon", *Seventeenth IEEE Photovoltaic Specialists Conference—1984*, Kissimmee, May 1, 1984, pp. 330–335.

*Primary Examiner*—Charles Bowers
*Assistant Examiner*—Keith Christianson

[57] ABSTRACT

Diffusion of ion-implanted dopant is controlled by incorporating electrically inactive impurity in a semiconductor layer by at least one crystal growth technique.

35 Claims, 3 Drawing Sheets

PROCESS FOR CONTROLLING DOPANT DIFFUSION IN A SEMICONDUCTOR LAYER

This is a divisional of application Ser. No. 08/348,013 filed Dec. 1, 1994 now U.S. Pat. No. 5,731,626.

TECHNICAL FIELD

This invention relates to a process for controlling the diffusion of ion-implanted dopant atoms in a semiconductor layer and to the semiconductor layer formed thereby.

BACKGROUND OF THE INVENTION

One feature of semiconductor materials that makes them so useful for electronic devices is that their electrical conductivity properties can be controlled by introducing small quantities of dopant atoms into the materials. The usual method of introducing dopant atoms which is controllable, reproducible and free from most undesirable side effects is ion implantation. During ion implantation, dopant atoms are ionized, accelerated and directed at a silicon substrate. They enter the crystal lattice of the silicon substrate, collide with silicon atoms and gradually lose energy, finally coming to rest at some depth within the lattice. The average depth can be controlled by adjusting the acceleration energy. The dopant dose can be controlled by monitoring the ion current during implantation. The principle side effect—disruption of the silicon lattice caused by ion collisions—is removed by subsequent heat treatment, i.e., annealing. Annealing is required to repair lattice damage and place dopant atoms on substitutional sites within the silicon substrate where they will be electrically active.

With the reduction of device sizes to the submicron range, diffusion of dopant atoms must be closely controlled in both the vertical and lateral directions within the silicon substrate. One method for controlling dopant diffusions is rapid thermal annealing. Rapid thermal annealing is a term that covers various methods of heating wafers for short periods of time, e.g., 100 seconds, which enable almost complete electrical activation with diffusion of dopant atoms occurring within what had been previously regarded as tolerable limits.

However, it has been observed that a phenomenon known as transient enhanced diffusion (TED) results even when rapid thermal annealing techniques are employed. Transient enhanced diffusion occurs during post-implant annealing and arises from the fact that the diffusion of dopant atoms, particularly boron (B) and phosphorus (P), is undesirably enhanced by excess silicon (Si) self-interstitials generated by the implant. The generation of excess Si self-interstitials by the implant also leads to a phenomenon herein referred to as dynamic clustering whereby implanted dopant atoms form clusters or agglomerates in a semiconductor layer. These clusters or agglomerates are immobile and electrically inactive. Whereas in the past TED and dynamic clustering were not issues which overly concerned device manufacturers, TED and dynamic clustering now threaten to impose severe limitations on the minimum device dimensions attainable in future silicon device technologies.

Recent investigations have been aimed at untangling the mechanisms of dopant diffusion in order to provide a sound basis for simulation programs designed to predict dopant diffusion during device processing. An additional challenge is the development of processing-compatible methods of controlling the diffusion of dopant atoms.

A significant reduction in dopant diffusion can be achieved by amorphizing the crystalline Si substrate prior to dopant implantation and annealing. However, it has proven to be difficult to control the defect band located close to the original amorphous Si/crystalline Si interface, which can result in increased junction leakage. Furthermore, additional interstitials are ejected from the defect band during further thermal processing, thus causing TED to persist. Recently, S. Nishikawa, A. Tanaka and T. Yamaji, Appl. Phys. Lett. 60, 2270 (1992), reported that dopant diffusion can be reduced when carbon (C) is co-implanted with boron into a silicon substrate. This reduction has been attributed to the fact that the implanted carbon provides a sink for excess interstitials during annealing. The efficiency of carbon co-implantation in suppressing dopant diffusion is limited by the fact that the carbon atoms must getter ion-generated interstitials from both the dopant and the carbon implant.

SUMMARY OF THE INVENTION

The diffusion of ion-implanted dopant atoms, e.g., boron, phosphorous, arsenic, etc., in a deposited semiconductor layer is controlled by the process which comprises incorporating a diffusion-suppressing amount of an electrically inactive impurity in the semiconductor layer by a crystal growth technique. The electrically inactive impurity, such as substitutional carbon, is preferably incorporated in the semiconductor layer by adding at least one species comprising the impurity to the crystal growth flux employed during conventional crystal growth techniques such as chemical vapor deposition and molecular beam epitaxy. For example, a carbon-containing gas can be added to the crystal growth flux during the chemical vapor deposition of an epitaxial silicon layer.

In one embodiment of the present invention, the electrically inactive impurity is incorporated throughout an entire semiconductor layer at concentrations which can be modified to control the diffusion of ion-implanted dopants in the vertical and/or lateral directions within the semiconductor layer.

In a second embodiment of the present invention, a semiconductor layer is provided in which at least two discrete regions or layers are formed, one region or layer possessing electrically inactive impurity and the other region or layer being substantially free of electrically inactive impurity. In this structure, the region or layer containing electrically inactive impurity blocks the diffusion of dopant atoms implanted in the region or layer which is substantially free of electrically inactive impurity.

The phrase "semiconductor layer" as utilized herein shall be understood to refer to any layer which is selectively or uniformly grown on a substrate by a crystal growth technique. Examples of such semiconductor layers include epitaxial silicon, polycrystalline silicon and silicon-germanium.

The term "diffusion" herein shall be understood to include both transient enhanced diffusion (TED) and dynamic clustering.

The phrase "crystal growth technique" herein is utilized in its broadest sense and shall therefore be understood to be inclusive of all techniques which can be employed to grow materials on a substrate. Techniques which therefore can be employed herein include chemical vapor deposition (CVD), molecular beam epitaxy, reactive magnetron sputtering, and the like.

The phrase "electrically inactive impurity" herein is also utilized in its broadest sense and includes any atom or molecule which, when introduced to a semiconductor layer as defined herein, will not interfere with the electrical properties of the semiconductor.

DETAILED DESCRIPTION OF THE PREFERRED EMBODIMENTS

Figure 1A:
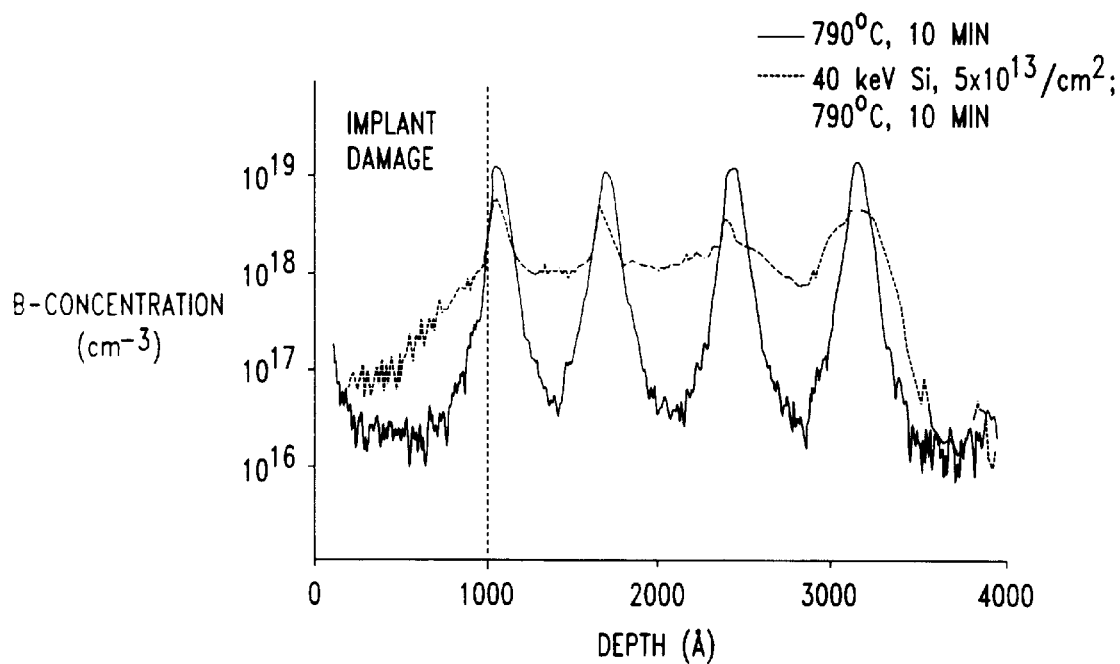
FIGS. 1A, 1B, 2A and 2B graphically depict secondary ion mass spectroscopy measurements of the depth distributions of boron diffusion profiles in epitaxial silicon.

The semiconductor layer containing electrically inactive impurity incorporated therein in accordance with the present invention is preferably an epitaxial silicon layer which is formed by a chemical vapor deposition (CVD) technique as disclosed in B. Jayant Baliga, ed., "Epitaxial Silicon Technology", Academic Press (1986).

Chemical vapor deposition typically involves decomposing gaseous mixtures of a silicon-containing gas or gases on a substrate at a temperature which usually ranges from about 100 to about 1300° C., preferably from about 800 to about 1200° C., and a pressure which usually ranges from about atmospheric to about 10 mTorr. The substrate on which the semiconductor layer is grown can be a silicon wafer which is typically prepared by the Czochralski technique. The wafer can possess any suitable orientation such as an (100), (110) or (111) orientation and can be heavily or lightly doped with impurity atoms as is well known in the art. Background electrical doping of the semiconductor layer can be achieved by adding, for instance, traces of a suitable dopant atom-containing gas, e.g., diborane ($B_2H_6$) or phosphine ($PH_3$), to the gaseous mixture. Any suitable silicon-containing gas or mixture thereof can be employed during CVD such as silane ($SiH_4$), disilane ($Si_2H_6$), dichlorosilane ($SiH_2Cl_2$), trichlorosilane ($SiHCl_3$), silicon tetrachloride ($SiCl_4$), and the like.

In accordance with the present invention, after the epitaxial growth process has been initiated, e.g., by introducing a silicon-containing gas into a hot-wall or cold-wall CVD chamber to provide a crystal growth flux, a species to be incorporated within the epitaxially grown layer of silicon, i.e., the electrically inactive impurity, is added to the crystal growth flux in the CVD chamber. The phrase "crystal growth flux" as utilized herein shall be understood to refer to the species supplied to the silicon substrate in order to establish crystal growth. Examples of species that will be electrically inactive include carbon, fluorine, nitrogen, oxygen and germanium. Carbon, which will occupy substitutional sites within the crystal lattice structure of the epitaxial silicon layer, is preferred. Thus, in a preferred embodiment of this invention, a carbon-containing gas or mixture of carbon-containing gases is added to the crystal growth flux during the chemical vapor deposition of an epitaxial silicon layer to thereby incorporate substitutional carbon within the deposited epitaxial silicon layer. The presence of substitutional carbon within such an epitaxial silicon layer has been demonstrated to be an effective means of controlling the diffusion, i.e., the transient enhanced diffusion and dynamic clustering, of subsequently ion-implanted dopant atoms.

In the case where the electrically inactive impurity is substitutional carbon, various carbon-containing gases and/or mixtures thereof can be employed in the process herein, including hydrocarbons such as methane ($CH_4$), ethylene ($C_2H_4$), acetylene ($C_2H_2$) and silacyclobutane ($C_3H_6SiH_2$). The hydrocarbons employed herein should be of high purity, i.e., ULSI grade.

The addition of the carbon-containing gas to the crystal growth flux during an epitaxial growth process is accomplished by adding the carbon-containing gas to the gas flow entering the CVD chamber. The flow rate of the gases entering the CVD chamber, including the carbon-containing gas, can broadly range from about 1 standard cubic centimeter per minute (sccm) to about 10 standard liters per minute (slpm). Preferably, substitutional carbon is incorporated in the deposited epitaxial silicon layer at a level, expressed in terms of concentration, which is less than about $1\times10^{20}$ $C/cm^3$. Preferably, concentrations which range from about $4\times10^{18}$ to about $1\times10^{20}$ $C/cm^3$, more preferably from about $1\times10^{19}$ to about $3\times10^{19}$ $C/cm^3$, are incorporated in the epitaxial silicon layer. The concentration of substitutional carbon incorporated in the epitaxial silicon layer can be controlled, of course, by controlling the amount of carbon-containing gas which is added to the gas flow during the epitaxial growth process. The amount of carbon-containing gas or gases added to the gas flow during CVD is largely dependent on the reactivity of the particular carbon-containing gas being employed. For example, acetylene has been found to be more reactive under MBE conditions than ethylene. Thus, ethylene might be employed in greater amounts relative to acetylene. Suitable gases and amounts to be employed can be readily determined by routine experimentation. ordinarily, the ratio of the carbon-containing gas to the silicon-containing gas will range from about 1:1 to about 1:10,000, with ratios ranging from about 1:100 to about 1:1000 being common. The amount of substitutional carbon which is incorporated in the semiconductor layer can therefore be closely controlled.

It can be seen, therefore, that in one embodiment of the present invention there is provided a process for incorporating an electrically inactive impurity throughout substantially the entire semiconductor layer which is grown on a silicon wafer utilizing a crystal growth technique. Dopants such as B, P, As, and the like, can thereafter be implanted to controllable depths in the semiconductor layer. Depths not exceeding about 20,000 Å, preferably not exceeding about 2,000 Å, and more preferably not exceeding about 500 Å, can be obtained. Various microelectronic devices can thus be fabricated at the semiconductor layer in accordance with known methods. Examples of such devices include MOS-type devices, e.g., n-MOS, p-MOS and CMOS devices, bipolar devices, BiCMOS, thin film transistors, heterojunction devices, and the like.

Where the incorporation of electrically inactive impurity in only selected regions of the semiconductor layer is desired, the species containing the electrically inactive impurity is introduced to the CVD chamber for a limited period of time. Thus, in a second embodiment of this invention, flow of a carbon-containing gas during chemical vapor deposition of an epitaxial silicon layer is discontinued prior to completion of the growth process. One structure which is contemplated in particular is the structure formed when the carbon-containing gas is allowed to flow in a first part of an epitaxial growth process and then shut off prior to completion of the growth process so that a substitutional carbon-free layer of epitaxial silicon can be grown on top of a substitutional carbon-containing layer of epitaxial silicon. When dopant atoms are subsequently ion implanted in the carbon-free region or layer of the epitaxial silicon layer possessing two such discrete regions or layers, the bottom layer containing substitutional carbon serves to block the diffusion of dopant atoms implanted in the top layer which is substantially free of substitutional carbon. Dopants such as B, P, As, and the like, can thereafter be implanted to controllable depths in the epitaxial silicon layer produced in accordance with this embodiment. Depths not exceeding about 20,000 Å, preferably not exceeding about 2,000 Å and more preferably not exceeding about 500 Å can be obtained. Various microelectronic devices can thus be formed at the epitaxial silicon layer containing one or more discrete regions or layers as disclosed hereinabove.

The following examples illustrate the benefits of the present invention.

EXAMPLE 1

In order to study dopant diffusion, i.e., transient enhanced diffusion, in the presence of substitutional carbon, the following boron diffusion markers were prepared. Boron-doped crystalline Si (c-Si) superlattices were grown on float-zone (FZ) Si(100) substrates at 600° C. by means of molecular beam epitaxy (MBE). This yielded four ~100 Å wide doping spikes of $1.5 \times 10^{13}$ B/cm² separated by 800 Å under a c-Si capping layer of 1000 Å. Such structures have proven very effective as diffusion markers in identifying the mechanisms of transient enhanced diffusion.

Substitutional carbon was incorporated at a growth rate of 0.6 Å/s during epitaxial silicon growth by introducing acetylene gas in the MBE chamber through a leak valve. The substrate temperature during deposition was 600° C. The background substitutional carbon level was $1 \times 10^{18}$ C/cm³ for the standard growth conditions, i.e., those conditions where no acetylene gas was introduced to the MBE chamber. Such background concentrations of substitutional carbon are typically present in all expitaxial layers grown by MBE as a result of the presence of minute concentrations of impurities in the apparatus used to grow the epitaxial layers. This background has traditionally been regarded as undesirable. The substitutional carbon level increased to $2 \times 10^{19}$ C/cm³ for growth under a background acetylene pressure of $10^{-7}$ Torr. The substitutional carbon incorporation at the boron doping spikes is increased by a factor of 3 due to growth interrupts. Transmission electron microscopy (TEM) shows no carbide precipitation upon annealing the substitutional carbon-rich silicon layers at 1000° C. for 1 h. This demonstrates that the incorporated carbon stays in solution up to high temperatures. The grown superlattices were subsequently implanted at room temperature with silicon at an energy of 40 keV to provide a Si dose of $5 \times 10^{13}$/cm². This non-amorphizing implant generates crystal damage in the 0.1 μm c-Si surface layer and is representative of typical dopant implants used in device processing. Samples were chemically cleaned and annealed in vacuum at 790° C. for 10 min. to induce diffusion. Boron diffusion profiles were measured using secondary ion mass spectrometry (SIMS) at a sputtering rate of 4 Å/s using 2 keV $O^+_2$, and carbon profiles were obtained at 12 Å/s using 3 keV $Cs^+$.

FIG. 1 shows SIMS-measurements of the boron profiles after annealing. Referring specifically to FIG. 1(a), for a superlattice containing a background concentration of substitutional carbon, i.e., a concentration of $1 \times 10^{18}$ C/cm³, the diffusion of the boron markers in the ion-implanted sample was strongly enhanced (~100x) compared to the thermal diffusion in the absence of damage generated by the implant. The increased diffusivity is caused by the injection of excess interstitials from the ion implant. A fraction of the boron-spikes closest to the implant damage remains immobile, which arises from the clustering of B under the wind of interstitials.

Figure 1B:
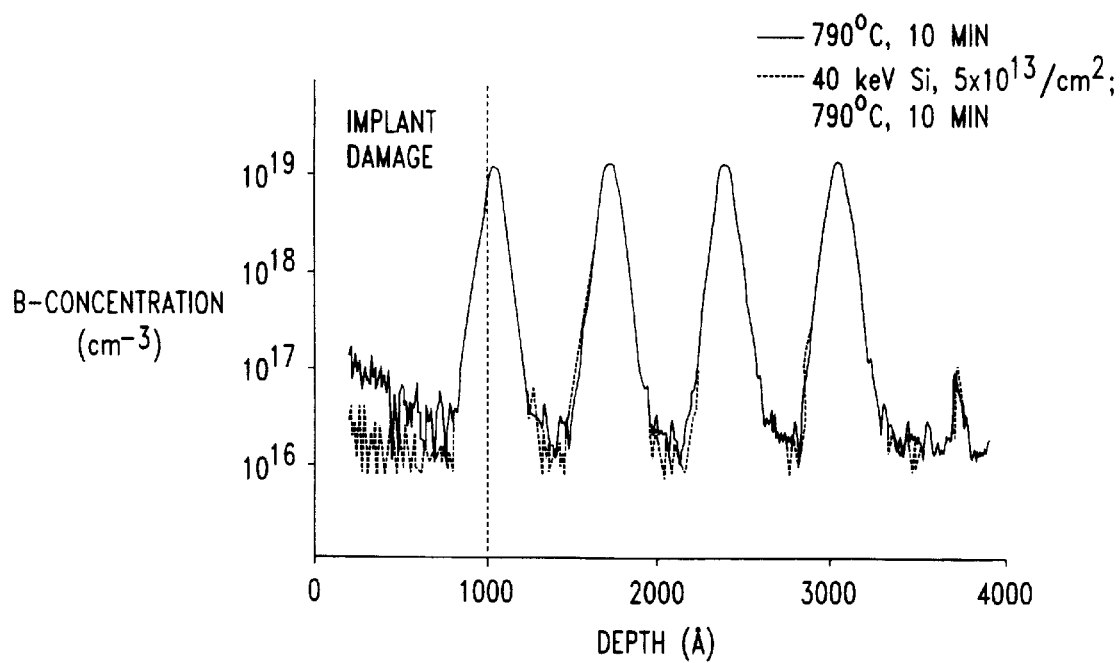

Referring now to FIG. 1(b), the boron diffusion in the ion-damaged superlattice containing substitutional carbon at a concentration of $2 \times 10^{19}$ C/cm³ in accordance with this invention shows no significant transient enhanced diffusion relative to thermal diffusion, indicating that the injection of interstitials from the ion-damaged region is suppressed.

The above example demonstrates that substitutional carbon acts as an efficient sink for ion-generated interstitials. While not wishing to be bound by theory, it is believed that carbon and interstitials combine to form mobile carbon-interstitial pairs, followed by the nucleation and growth of larger carbon-interstitial agglomerates.

EXAMPLE 2

The diffusion behavior and the electrical properties of ion-implanted B profiles in C-rich c-Si were investigated as follows. To this end, p- and n-doped float-zone Si(100) wafers were amorphized to a depth of 2 μm at ~77K using 0.5, 1, and 2 MeV Si implants to a total fluence of $1.5 \times 10^{16}$/cm². Part of the wafers was implanted with C at energies of 10, 28, 65, 130, 230, and 400 keV to doses of 1.3, 3.2, 6.0, 8.7, 11.3, and $13.3 \times 10^{13}$/cm², respectively. The samples were annealed in vacuum at 500° C. for 1 h, 600° C. for 2 h, and 900° C. for 15 min to regrow the amorphous Si (a-Si) layer by solid phase epitaxy (SPE) and dissolve the implanted C in the c-Si lattice. Carbon regrows onto substitutional sites during SPE of a-Si. The substitutional carbon level obtained varied between about $4 \times 10^{18}$ and about $6 \times 10^{18}$ C/cm³ throughout the surface 1 μm of the sample as determined by SIMS. The C-rich samples (CSPE) and reference samples (SPE) were implanted at room temperature with $1.5 \times 10^{14}$/cm², 30 keV B. The samples were tilted by 7° with respect to the ion beam in order to minimize channeling. Diffusion anneals were performed in vacuum at 800° C. for 35 min. and at 950° C. for 15 min.

Figure 2A:
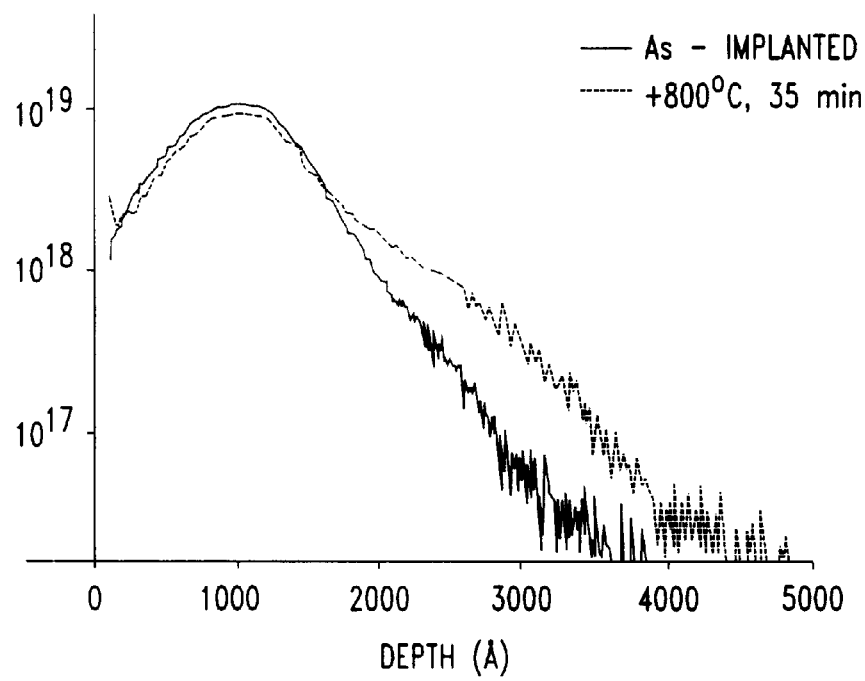

FIG. 2 shows the boron profiles before and after boron diffusion as measured by SIMS. Referring to FIG. 2(a), the diffusion profile of boron in the reference sample after annealing at 800° C. for 35 min. exhibits all the features characteristic to TED: boron in the tail of the implanted profile has diffused over ~700 Å, whereas the equilibrium diffusion length $L_{eq}$ for this anneal is only ~25 Å. In addition, the peak portion of the profile above $1 \times 10^{18}$/cm³ has remained immobile due to the clustering of boron driven by the excess interstitials.

Figure 2B:
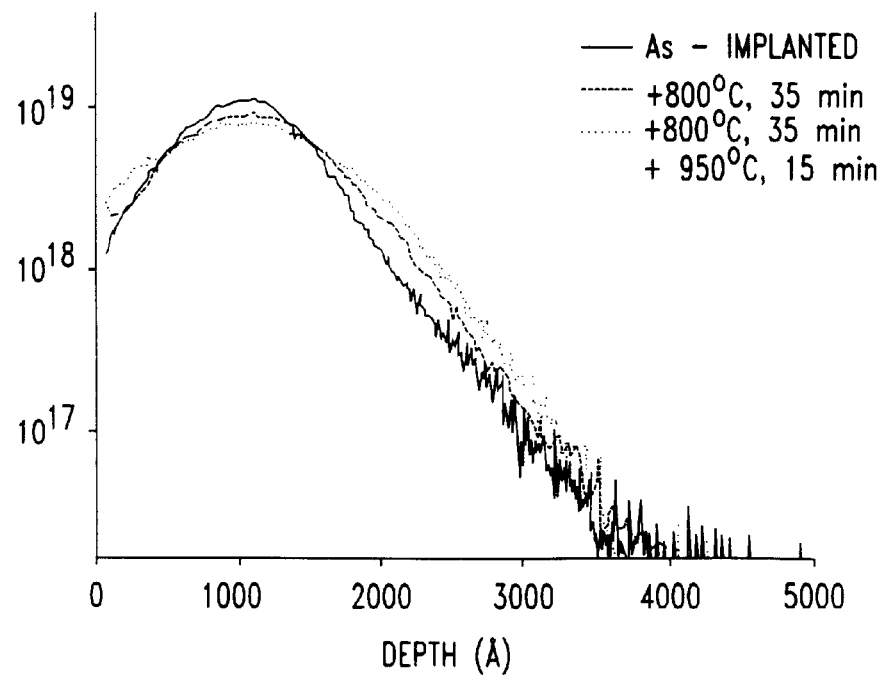

Referring now to FIG. 2(b), the diffusion behavior for the C-rich substrate CSPE is very different. First, the diffusion of boron in the tail of the boron profile is strongly reduced at both 800 and 950° C. In addition, there is no pronounced signature of immobile boron clusters in the peak of the boron profile. This demonstrates that substitutional carbon acts as a trap for interstitials thereby suppressing both the transient enhanced boron diffusion and the interstitial-driven clustering of boron.

Figure 3:
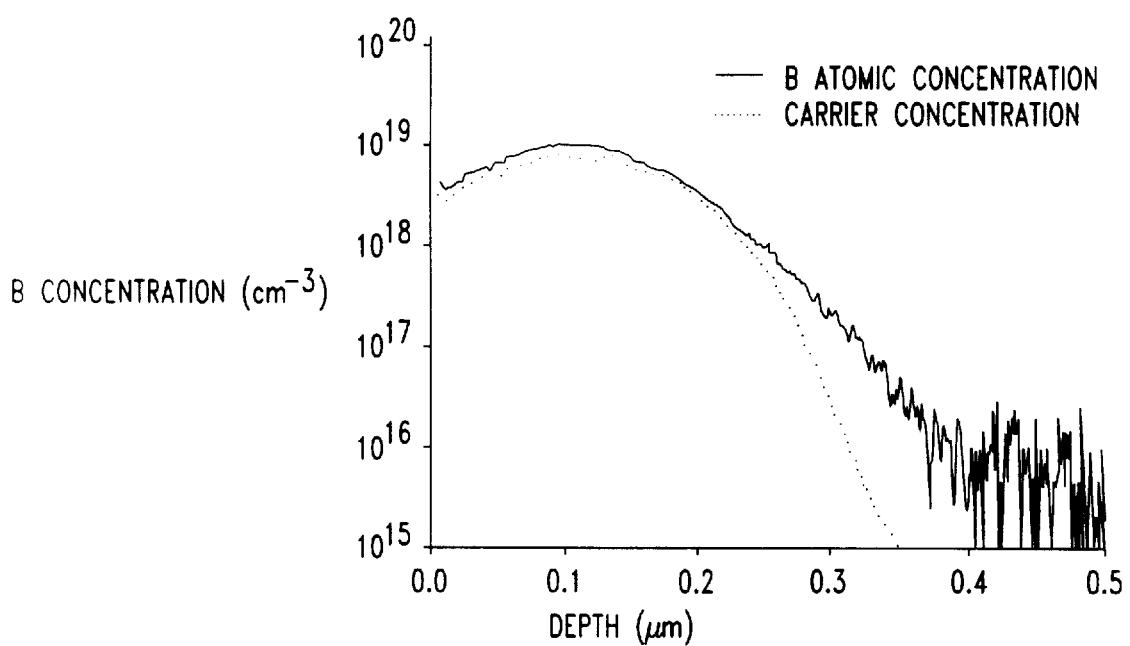
FIG. 3 graphically depicts atomic and electrical boron depth distributions in epitaxial silicon.

The spreading resistance measurements of FIG. 3 show that the major part (~80%) of the boron profile is electrically active after the 950° C. annealing step. In addition, Hall measurements on boron profiles in n-type, C-rich substrates show that the electrically active fraction after diffusion at 800° C. is approximately 60% and increases to ~85% upon further annealing at 950° C. Comparable active fractions were found for boron profiles implanted into FZ substrates and annealed under the same conditions. These electrical data demonstrate that the presence of C and/or C-interstitial agglomerates does not deteriorate the doping efficiency to unacceptable levels.

While the invention has been particularly shown and described with reference to various embodiments, it will be recognized by those skilled in the art that modifications and changes may be made to the present invention without departing from the spirit and scope thereof, which is set forth in the following claims.

What is claimed is:

1. A process for making a microelectronic device which comprises:

(a) incorporating a diffusion-suppressing amount of electrically inactive impurity in a crystal growth flux;

(b) depositing a crystalline first semiconductor layer on a crystalline semiconductor substrate by at least one crystal growth technique from said crystal growth flux; and (c) forming a second semiconductor layer on the first semiconductor layer, the second semiconductor layer containing an electrically active dopant.

2. The process of claim 1 wherein the electrically inactive impurity is selected from the group consisting of carbon, fluorine, nitrogen, oxygen and germanium.

3. A process for making a microelectronic device which comprises:

a) incorporating a diffusion-suppressing amount of electrically inactive impurity in a crystal growth flux, wherein the electrically inactive impurity is substitutional carbon;

(b) depositing an epitaxial silicon first semiconductor layer on a crystalline semiconductor substrate by at least one crystal growth technique from said crystal growth flux, said first semiconductor layer containing said substitutional carbon; and c) depositing an epitaxial silicon second semiconductor layer on the first semiconductor layer, the second semiconductor layer containing an electrically active dopant.

4. The process of claim 3 wherein the amount of substitutional carbon incorporated in the semiconductor layer is less than about $1 \times 10^{20}$ C/cm$^3$.

5. The process of claim 3 wherein the amount of substitutional carbon incorporated in the semiconductor layer ranges from about $4 \times 10^{18}$ to about $1 \times 10^{20}$ C/cm$^3$.

6. The process of claim 3 wherein the amount of substitutional carbon incorporated in the semiconductor layer ranges from about $1 \times 10^{19}$ to about $3 \times 10^{19}$ C/cm$^3$.

7. The process of claim 1 wherein the first and second semiconductor layers are selected from the group consisting of epitaxial silicon, polycrystalline silicon and silicon-germanium.

8. The process of claim 1 wherein the crystal growth technique is selected from the group consisting of chemical vapor deposition, molecular beam epitaxy and reactive magnetron sputtering.

9. A process for making a microelectronic device which comprises:

a) incorporating a diffusion-suppressing amount of electrically inactive impurity in a crystal growth flux;

b) depositing an epitaxial silicon first semiconductor layer on a crystalline semiconductor substrate by chemical vapor deposition of said crystal growth flux, said first semiconductor layer containing said electrically inactive impurity; and c) depositing a second semiconductor layer on the first semiconductor layer, the second semiconductor layer containing an electrically active dopant.

10. A process for making a microelectronic device which comprises:

a) incorporating a diffusion-suppressing amount of electrically inactive impurity in a crystal growth flux;

b) depositing a crystalline first semiconductor layer from said crystal growth flux on a crystalline semiconductor substrate by at least one crystal growth technique, said first semiconductor layer containing said electrically inactive impurity; and c) ion implanting an electrically active dopant in the first semiconductor layer containing said electrically inactive impurity.

11. The process of claim 10 wherein the semiconductor layer is selected from the group consisting of epitaxial silicon, polycrystalline silicon and silicon-germanium.

12. The process of claim 10 wherein the electrically inactive impurity is selected from the group consisting of carbon, fluorine, nitrogen, oxygen and germanium.

13. The process of claim 10 wherein the electrically inactive impurity is substitutional carbon.

14. A process for growing a semiconductor layer having substitutional carbon incorporated therein which comprises:

a) introducing a mixture of carbon-containing gas and silicon-containing gas in a ratio of from about 1:1 to about 1:10,000 into a chamber with a crystalline semiconductor substrate therein; and b) decomposing said mixture in said chamber under chemical vapor deposition conditions to form an epitaxial layer of silicon containing a diffusion suppressing amount of carbon on said crystalline semiconductor substrate.

15. A process for growing a semiconductor layer having substitutional carbon incorporated therein which comprises:

a) introducing a mixture of carbon-containing gas and silicon-containing gas in a ratio of from about 1:1 to about 1:10,000, said mixture further containing a dopant into a chamber with a crystalline semiconductor substrate therein; and b) decomposing said mixture under chemical vapor deposition conditions to form an epitaxial layer of silicon containing said dopant and a diffusion suppressing amount of carbon on said crystalline semiconductor substrate.

16. The process of claim 15 wherein the silicon-containing gas is selected from the group consisting of silane, disilane, dichlorosilane, trichlorosilane and silicon tetrachloride.

17. The process of claim 15 wherein the carbon-containing gas is selected from the group consisting of methane, ethylene, acetylene and silacyclobutane.

18. The process of claim 15 wherein the dopant atom-containing gas is selected from the group consisting of diborane and phosphine.

19. The process of claim 14 wherein the amount of substitutional carbon incorporated in the semiconductor layer ranges from about $4 \times 10^{18}$ to about $1 \times 10^{20}$ C/cm$^3$.

20. The process of claim 15 wherein the amount of substitutional carbon incorporated in the semiconductor layer ranges from about $1 \times 10^{19}$ to about $3 \times 10^{19}$ C/cm$^3$.

21. A process for fabricating a microelectronic device which comprises:

a) depositing a crystalline silicon semiconductor layer from a crystal growth flux containing silicon and substitutional carbon to form a substrate by at least one crystal growth technique, and b) introducing dopant into the crystalline silicon semiconductor layer of the substrate to fabricate the device at the crystalline silicon semiconductor layer.

22. The process of claim 21 wherein the step of introducing dopant comprises ion-implanting the dopant in the crystalline silicon semiconductor layer.

23. The process of claim 22 wherein the ion-implanted dopant is selected from the group consisting of boron, phosphorus and arsenic.

24. The process of claim 22 wherein the dopant is implanted in the crystalline silicon semiconductor layer to a depth not exceeding about 20,000 Å.

25. The process of claim 22 wherein the dopant is implanted in the crystalline silicon semiconductor layer to a depth not exceeding about 2,000 Å.

26. The process of claim 22 wherein the dopant is implanted in the crystalline silicon semiconductor layer to a depth not exceeding about 500 Å.

27. The process of claim 21 wherein the crystal growth technique is chemical vapor deposition.

28. The process of claim 21 wherein the crystalline silicon semiconductor layer is selected from the group consisting of epitaxial silicon, polycrystalline silicon and silicon-germanium.

29. The process of claim 21 wherein the crystalline silicon semiconductor layer is epitaxial silicon.

30. The process of claim 21 wherein the crystalline silicon semiconductor layer is polycrystalline silicon.

31. The process of claim 21 further including the step of annealing the semiconductor layer of silicon.

32. A process for fabricating a microelectronic device comprising:
   a) providing a crystal growth flux which includes a silicon containing gas;
   b) providing a carbon containing gas;
   c) depositing a first layer of silicon which contains substitutional carbon onto a substrate, the silicon and carbon being derived from the silicon containing gas and the carbon containing gas;
   d) depositing a second layer of silicon onto the first layer of silicon, the second layer of silicon containing substantially no substitutional carbon; and,
   e) implanting at least one dopant into the second layer of silicon.

33. The process of claim 32 wherein the silicon containing gas is selected from the group consisting of silane, disilane, dichlorosilane, trichlorosilane and silicon tetrachloride.

34. The process of claim 32 wherein the carbon containing gas is selected from the group consisting of methane, ethylene, acetylene and silacyclobutane.

35. The process of claim 32 wherein the dopant is selected from the group consisting of boron, phosphorus and arsenic.

* * * * *